(12) United States Patent
Yoon et al.

(10) Patent No.: US 9,493,702 B2
(45) Date of Patent: Nov. 15, 2016

(54) GARNET-BASED PHOSPHOR DOPED WITH THORIUM AND LIGHT EMITTING DEVICE USING THE SAME

(71) Applicant: FORCE4 CORP., Gwangju (KR)

(72) Inventors: Ho Shin Yoon, Gwangju (KR); Seung Hyok Park, Gwangju (KR); Jun Cho, Gwangju (KR); Hye Min Boo, Gwangju (KR); Sung Kyoung Jung, Gwangju (KR)

(73) Assignee: FORCE4 CORP., Gwangju (KR)

( * ) Notice: Subject to any disclaimer, the term of this patent is extended or adjusted under 35 U.S.C. 154(b) by 0 days.

(21) Appl. No.: 14/406,009

(22) PCT Filed: Oct. 21, 2013

(86) PCT No.: PCT/KR2013/009386
§ 371 (c)(1),
(2) Date: Dec. 5, 2014

(87) PCT Pub. No.: WO2014/065549
PCT Pub. Date: May 1, 2014

(65) Prior Publication Data
US 2015/0259595 A1  Sep. 17, 2015

(30) Foreign Application Priority Data
Oct. 25, 2012 (KR) .................. 10-2012-0119092

(51) Int. Cl.
*C09K 11/77* (2006.01)
*C09K 11/64* (2006.01)
*C09K 11/02* (2006.01)
*H01L 33/50* (2010.01)
*H01L 33/52* (2010.01)

(52) U.S. Cl.
CPC .......... *C09K 11/7774* (2013.01); *C09K 11/025* (2013.01); *C09K 11/646* (2013.01); *H01L 33/502* (2013.01); *H01L 33/507* (2013.01); *H01L 33/52* (2013.01); *H01L 2224/48091* (2013.01); *H01L 2224/48247* (2013.01); *H01L 2224/48257* (2013.01); *H01L 2224/49107* (2013.01); *H01L 2224/8592* (2013.01); *H01L 2924/181* (2013.01)

(58) Field of Classification Search
CPC ....... H01L 33/60; H01L 33/20; H01L 33/62; H01L 33/54; H01L 33/44
See application file for complete search history.

(56) References Cited

U.S. PATENT DOCUMENTS

| 8,350,465 | B2 | 1/2013 | Winkler et al. | |
| 2004/0135504 | A1* | 7/2004 | Tamaki | C01B 21/0602 313/512 |
| 2008/0150416 | A1* | 6/2008 | Maruyama | H01J 9/221 313/503 |

(Continued)

FOREIGN PATENT DOCUMENTS

| KR | 100094243 | 1/1996 |
| KR | 1020100015388 | 2/2010 |
| KR | 1020120063923 | 6/2012 |

*Primary Examiner* — Mohsen Ahmadi
*Assistant Examiner* — Long Le
(74) *Attorney, Agent, or Firm* — IPLA P.A.; James E. Bame (57) ABSTRACT

Provided is a garnet-based phosphor doped with thorium and a light emitting device using the same. In particular, a garnet-based phosphor having superior light characteristics and heat stability by using thorium as an activator, when compared to a conventional garnet phosphor using cerium as an activator, and a light emitting device using the same as a light source are provided.

13 Claims, 4 Drawing Sheets

(56) References Cited

U.S. PATENT DOCUMENTS

| | | | | |
|---|---|---|---|---|
| 2010/0084962 A1* | 4/2010 | Winkler | ............ | C09K 11/7774 313/484 |
| 2011/0227475 A1* | 9/2011 | Winkler | ............ | C09K 11/7768 313/484 |
| 2011/0279022 A1* | 11/2011 | Winkler | ............ | C09K 11/7774 313/504 |
| 2011/0309384 A1* | 12/2011 | Ito | ............ | H01L 33/505 257/88 |
| 2014/0077687 A1* | 3/2014 | Kim | ............ | C09K 11/0883 313/503 |

\* cited by examiner

GARNET-BASED PHOSPHOR DOPED WITH THORIUM AND LIGHT EMITTING DEVICE USING THE SAME

BACKGROUND

The present invention relates to a phosphor for white light emitting diode and a light emitting device using the same as a light source.

Recently, there are two methods to manufacture and a white LED using a fluorescent material and a GaN or InGaN chip.

The methods use a single chip and coat a fluorescent material on a blue LED chip or a near-ultraviolet (NUV) LED chip to obtain white light. In particular, the methods use blue light released from a blue LED and yellow light obtained by exciting $Y_3Al_5O_{12}:Ce^{3+}$ (YAG:Ce) using some of the blue light, by applying a fluorescent material to one chip, to release a white color.

Like this, a white LED uses a fluorescent material, which converts a blue LED and blue light released from the blue LED into a yellow color, or a fluorescent material, which converts a near-ultraviolet LED and the near-ultraviolet into blue, green and red colors, to realize a white LED. Therefore, a fluorescent material for an LED used in a white LED device is a ceramic powder material converting light released from an LED into visible light (namely, red, yellow, green, and blue light) and is an essential material to realize white light. That is, light emitting efficiency of phosphors is one variable related to white light emission when applied to a light emitting diode.

Meanwhile, presently used garnet-based phosphors have advantages such as high fluorescence efficiency and broad applicability, but does not autonomously emit blue light and has drawbacks such as lack of fluorescence in a red wavelength area. Therefore, when white light emitting diode is realized using the light source, white light in a cool white light area is released by low red light emitting characteristics and narrow blue excitation light and, as such, white light having a low color rendering index and high color temperature is realized.

In addition, U.S. Pat. Nos. 8,088,304 and 0,279,022 disclose technologies with respect to a garnet-based phosphor using cerium as an activator. The technologies tried to improve light characteristics by adding a small amount of thorium. However, the inventions used cerium as a main activator and thereby a light emitting wavelength range of garnet-based phosphors is limited and the above problems are still present.

SUMMARY OF THE INVENTION

Therefore, the present invention has been made in view of the above problems, and it is one object of the present invention to provide a new garnet-based phosphor which may emit light in a more variable wavelength area than a conventional garnet-based phosphor.

Another object of the present invention is to provide a phosphor for a white LED having dramatically improved high-temperature stability and light emitting characteristics, when compared to conventional phosphors, wherein the phosphor is a garnet-based phosphor in which an octahedral site of a garnet structure is doped with an activator including thorium (Th) as a main ingredient, and a light emitting device (namely, a white light emitting LED) using the same.

In addition, the present invention provides a phosphor-containing composition using the garnet-based phosphor.

In accordance with an aspect of the present invention, the above and other objects can be accomplished by the provision of a garnet-based phosphor doped with thorium as an activator represented by Formula 1 below.

$(L_{1-x-y}Th_xM_y)_3N_5O_{12}$  [Formula 1]

wherein $0<x<1$, $0\leq y<1$, and $x+y<1$,

L is at least one selected from the group consisting of Y, Gd, Lu, Sc, La, Bi, Ir and Sb, M is selected from the group consisting of Pr, Tb, Sm, Se, U, Li and Na, and N is at least one selected from the group consisting of Al, Ga and In.

The garnet-based phosphor according to the present invention preferably satisfies that $0<x<1$ and $y=0$ in Formula 1.

In addition, the garnet-based phosphor according to the present invention preferably satisfies that $0<x<1$, $y=0$, L is Y, and N is Al in Formula 1.

The phosphor of Formula 1 may be prepared by selectively using at least one flux selected from the group consisting of $NH_4Cl$, $NH_4F$, $BaF_2$, $CaF_2$, $MgF_2$, $YF_3$, $YCl_3$ and LiCl.

When the garnet-based phosphor uses ultraviolet or visible light having a wavelength of 100 nm to 600 nm as an excitation source, light may be emitted. In addition, a central light emitting wavelength of the phosphor is 490 to 700 nm.

In accordance with another aspect of the present invention, there is provided a mixed phosphor including the garnet-based phosphor of Formula 1; and two or more of compounds selected from the group consisting of (CaSr)AlSiN$_3$, SrGaS$_4$, CaS, $\alpha$-SiAlON, $\beta$-SiAlON, (SrBaCa)$_2$Si$_1$O$_4$, (SrBaCa)$_1$Si$_2$O$_2$N$_2$, (CaSr)$_2$Si$_5$N$_8$ and La$_3$Si$_6$N$_{11}$.

In accordance with another aspect of the present invention, there is provided a light emitting device including the phosphor of Formula 1 or the mixed phosphor including the phosphor of Formula 1.

Here, the light emitting device may have a color rendering (Ra) of greater than 80.

The light emitting device may be a light emitting diode, a laser diode, a surface light emitting laser diode, an inorganic electroluminescent device or an organic electroluminescent device.

In the light emitting diode, a light emitting diode chip may be blue light emitting diode chip.

In the light emitting diode, the light emitting diode chip and the phosphor may be molded with a transmissive resin.

In accordance with yet another aspect of the present invention, there is provided the garnet-based phosphor of Formula 1, and a coating phosphor composition for a light emitting diode including the transmissive resin.

The present invention provides a garnet-based using an easy method using thorium as an activator and may provide a phosphor having superior light emission stability and high luminance.

In the present invention, when thorium is used as an activator, a white LED lamp having similar or higher luminance and excellent stability, when compared to a conventional case using cerium as an activator, may be realized and, as such, a high-quality light source may be provided in general lighting and in application fields requiring white light having high luminance and high color rendering.

DETAILED DESCRIPTION OF THE INVENTION

Hereinafter, the present invention will be described in more detail. The terms and the words in the specification and the claims should not be interpreted as being limited to conventional or dictionary meanings thereof and should be interpreted as meanings and concepts coinciding with technical though based on a principle that inventors can define concepts of terms to explain their invention in a best method.

The present invention relates to a new garnet-based phosphor using thorium as a main activator to use a light source of a light emitting device, and a light emitting device using the same. Hereinafter, the garnet-based phosphor according to the present invention and a method of preparing the same will be described in more detail.

In accordance with one embodiment of the present invention, a garnet-based phosphor doped with thorium as an activator represented by Formula 1 below is provided.

$(L_{1-x-y}Th_xM_y)_3N_5O_{12}$     [Formula 1]

wherein $0<x<1$, $0 \le y<1$, and $x+y<1$,

L is at least one selected from the group consisting of Y, Gd, Lu, Sc, La, Bi, Ir and Sb, M is selected from the group consisting of Pr, Tb, Sm, Se, U, Li and Na, N is at least one selected from the group consisting of Al, Ga and In.

As shown in Formula 1, the phosphor according to the present invention is characterized by using thorium (Th) as a main activator in a different manner than a convention phosphor.

That is, as described above, a light emitting wavelength range of conventional garnet-based phosphor using cerium included in rare earth elements as an activator is limited and thereby light emitting characteristics are also limited. Accordingly, a phosphor which may emit light in a more variable area has been required.

Therefore, the inventors of the present invention continuously performed a variety of research and thereby developed a phosphor which may emit light in a more variable wavelength area than a conventional garnet-based phosphor by specifically using thorium, in which is an actinide, as an activator.

Accordingly, inventors of the present invention used thorium as an activator and, as such, developed a phosphor having superior light characteristics and heat stability heat stability when compared to a conventional garnet phosphor using cerium as an activator.

In other words, inventors of the present invention used thorium (Th) as main activation ions instead of cerium conventionally used as an activator to improve fluorescence characteristics of the phosphor. Therefore, in the present invention, cerium is not used at all and merely thorium is used as a main activator, and thereby, when compared to a conventional garnet-based phosphor using cerium as a main activator, phosphor, which is differentiated from conventional phosphors, by having superior light characteristics and stable light emission characteristics may be provided.

In addition, the present invention provides a phosphor-containing composition and a light emitting device using the phosphor having superior light emission characteristics, and an image display device and a lighting device using the light emitting device.

The garnet-based phosphor according to the present invention preferably satisfies that $0<x<1$ and $y=0$ in Formula 1.

In addition, the garnet-based phosphor according to the present invention preferably satisfies that $0<x<1$, $y=0$, L is Y, and N is Al in Formula 1.

The phosphor of Formula 1 may be prepared by selectively using at least one flux selected from the group consisting of $NH_4Cl$, $NH_4F$, $BaF_2$, $CaF_2$, $MgF_2$, $YF_3$, $YCl_3$ and $LiCl$.

The garnet-based phosphor may emit light when ultraviolet rays or visible light having a wavelength of 100 nm to 600 nm are used as an excitation source. In addition, a central light emitting wavelength of the phosphor is characterized as being is 490 to 700 nm.

Meanwhile, the new garnet-based phosphor of Formula 1 of the present invention may be prepared using a solid-state method. Accordingly, in accordance with a preferred embodiment, a method of preparing the phosphor according to the present invention includes:

a) i) wet mixing or dry mixing a metal oxide or carbonate including at least one selected from the group consisting of Y, Gd, Lu, Sc, La, Bi, Ir and Sb, ii) an oxide and/or a metal halide including at least one element selected from the group consisting of Al, Ga and In, and iii) an oxide and/or a halide of Th as an activator, in a solvent;

b) heat-treating a mixture obtained from step (a) under a reducing atmosphere;

c) comminuting and classifying phosphor obtained by heat-treating under the reducing atmosphere to obtain phosphor powder having a constant size; and d) removing unreacted material from the phosphor obtained from step (c).

Step (a)

In step (a), the ingredients of (i) to (iii) are weighed in a predetermined amount and then are wet mixed in a solvent or dry mixed without a solvent. Subsequently, a resulting mixture is dried. Here, a content ratio of the ingredient of (i) to (iii) may be properly controlled in a range satisfying a composition range of the present invention to have the empirical formula of Formula 1. In particular, the present invention controls a content range of the ingredient of (iii) such that thorium as an activator ingredient is included as a main ingredient, to exhibit superior light emitting characteristics than a conventional case using cerium as an activator. In Formula 1, the amount of thorium is preferably 0.005 to 0.2 mol, more preferably 0.01 to 0.07 mol.

In addition, in accordance with the present invention, the phosphor of Formula 1 may be prepared by using at least one flux selected from the group consisting of $NH_4Cl$, $NH_4F$, $BaF_2$, $CaF_2$, $MgF_2$, $YF_3$, $YCl_3$ and $LiCl$. The flux may be used in an amount of 1 to 20 wt %, preferably 2 to 15 wt %, more preferably 4 to 10 wt %, based on the total weight of the phosphor.

Therefore, in step (a), $NH_4Cl$, $NH_4F$, $BaF_2$, $CaF_2$, $MgF_2$, $YF_3$, $YCl_3$ or LiCl as a flux may be additionally mixed and a resulting mixture may be wet mixed in a solvent or dry mixed, to prepare a phosphor.

As wet mixing proceeds, alcohol, acetone or distilled water may be used as a solvent.

Step (b)

The mixture mixed according to the method is heat-treated and, before heat-treating, a conventional drying process may be further performed.

In addition, temperature of the reduction reaction is 1200 to 2000° C., preferably 1500 to 1700° C. which is sufficient temperature to complete reaction. Heat-treating time may be time sufficient to complete reaction and preferably 1 to 48 hours. Under a reducing atmosphere, when heat treatment temperature is less than 1200° C., a crystal of the phosphor according to the present invention is not completely formed and thereby light emitting efficiency is reduced. On the other hand, when heat treatment temperature exceeds 2000° C., there are a variety of problems such as luminance reduction due to over-reaction and the like.

Step (c)

The phosphor obtained according to Step (c) is coagulated due to high heat treatment temperature and thereby comminution and classification processes are required to produce powder having a preferable luminance and size. Accordingly, the present invention may provide a phosphor having improved light emission characteristics by performing step (c). The comminution and classification processes may be performed according to a conventional method and are not specifically limited. For example, a phosphor, heat-treating of which has been completed, may be comminuted to an average particle size of 20 μm or less and may be classified using a classifier of 25 to 32 μm.

Step (d)

In addition, the phosphor obtained by heat-treating under the reducing atmosphere may include a small amount of unreacted materials as impurities. When a light emitting device using the phosphor is manufactured without removing such impurities, moisture proofing may be deteriorated. Accordingly, the phosphor according to the present invention is cleaned to remove unreacted materials.

To remove unreacted materials, it is preferable to use at least one of materials such as alcohol, acetone or polymer solvent and the like. To remove unreacted materials, a drying method after adding the solvents to the phosphor described above and mixing may be used, but the present invention is not specifically limited thereto. As methods to remove unreacted materials, a variety of physical and chemical methods such as heat treatment, extraction and the like may be used.

In addition, in the present invention, step (c) may be performed after performing step (d). The phosphor by heat-treating under reducing atmosphere may include a small amount of a halogen compound.

In addition, in accordance with another embodiment of the present invention, a mixed phosphor including the garnet-based phosphor of Formula 1 described above; and two or more of additive compounds selected from the group consisting of $(CaSr)AlSiN_3$, $SrGaS_4$, CaS, α-SiAlON, β-SiAlON, $(SrBaCa)_2Si_1O_4$, $(SrBaCa)_1Si_2O_2N_2$, $(CaSr)_2Si_5N_8$ and $La_3Si_6N_{11}$ is provided.

Here, in the mixed phosphor, the garnet-based phosphor of Formula 1 and the additive compounds may be used by mixing in a weight ratio of 9:1 to 8:2, but the present invention is not limited thereto.

Meanwhile, in accordance with another embodiment of the present invention, a light emitting device including the phosphor of Formula 1 described above, or the mixed phosphor including the phosphor of Formula 1 is provided.

The light emitting device may be a light emitting diode, a laser diode, a surface light emitting laser diode, an inorganic electroluminescent device or an organic electroluminescent device, preferably a light emitting diode.

Here, the light emitting device may have a color rendering (Ra) of greater than 80.

When the light emitting device is a light emitting diode, a light emitting diode chip of the light emitting diode is characterized as being blue light emitting diode chip. In the light emitting diode, the light emitting diode chip and phosphor may be molded by a transmissive resin. A molding member of the present invention may be a light transmissive epoxy resin or a light transmissive silicon resin.

In particular, when the phosphor is included in a molding material of a light emitting device using a light emitting diode, the present invention is characterized by providing a phosphor having a garnet-based structure, which has a central wavelength of 490 nm to 700 nm by being excited by a compound semiconductor, and doped with thorium (Th) as an activator.

In addition, the present invention provides the garnet-based phosphor of Formula 1, and a coating phosphor composition for a light emitting diode including a transmissive resin. The phosphor of Formula 1 and the light transmissive resin may be mixed in any possible weight ratios, preferably in a weight ratio of 1:10 to 1:20.

Figure 1:
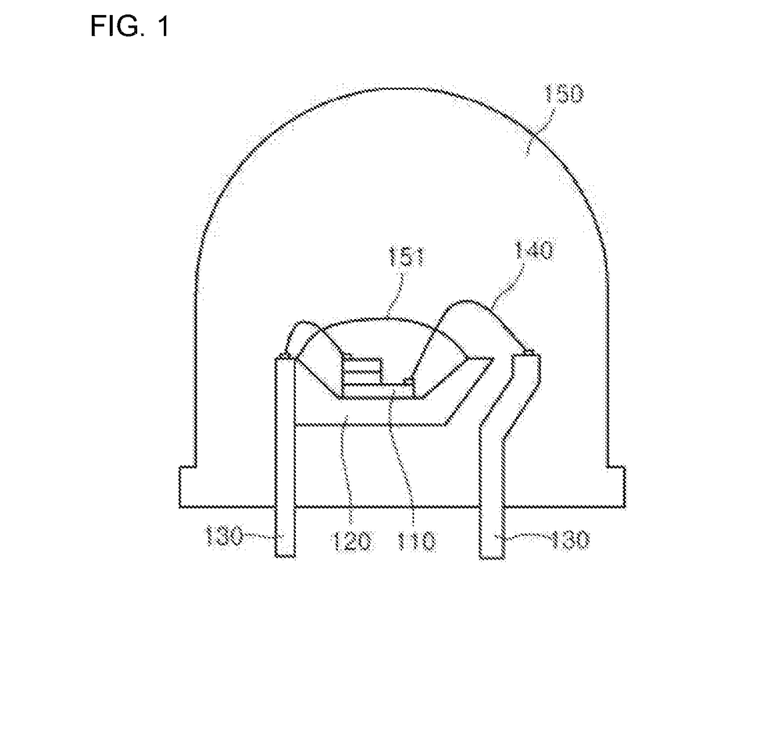
FIG. 1 simply illustrates a structure of white light emitting diode to which a concept of the present invention is applied.

Meanwhile, FIG. 1 is a structure of white light emitting diode to which a concept of the present invention is applied.

Referring to FIG. 1, the light emitting device includes a light emitting diode chip 110, a substrate 120 supporting the light emitting diode chip 110 and reflecting light released from the light emitting diode chip 110 in the direction of an upper portion, two electrically insulated conductive members 130 providing power to the light emitting diode chip 110, the wire 140 electrically connecting the light emitting diode chip 110 and the two conductive members 130, a molding member 150 made of a colorless or colored light transmissive resin molding the light emitting diode chip 110, and a phosphor 151 entirely or partially dispersed in the molding member 150.

Figure 2:
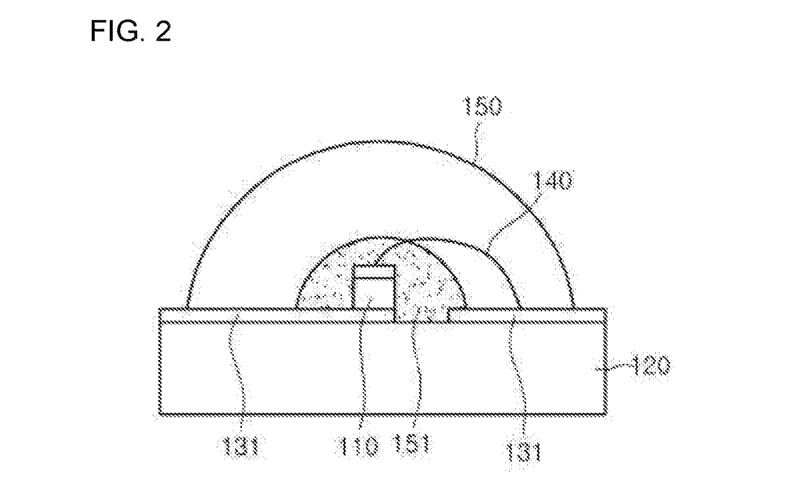
FIG. 2 simply illustrates a structure of a light emitting device according to another embodiment of the present invention.

FIG. 2 is a view exemplifying another structure of the light emitting device.

Referring to FIG. 2, the light emitting device includes a light emitting diode chip 110, a substrate 120 supporting the light emitting diode chip 110 and reflecting light released from the light emitting diode chip 110 in an upper portion direction, two electrically insulated electrode layers 131 providing power to the light emitting diode chip 110, the wire 140 electrically connecting the light emitting diode chip 110 and the two electrode layers 131, a molding member 150 made of a colorless or colored light transmissive resin molding the light emitting diode chip 110, and phosphor 151 entirely or partially dispersed in the molding member 150. In the light emitting device illustrated in FIG. 2, the wire 140 electrically connects the light emitting diode chip 110 and one of the electrode layers 131. The light emitting diode chip 110 is mounted in another one of the electrode layers 131 and thereby is electrically connected.

As exemplified in FIGS. 1 and 2, the light emitting device includes the light emitting diode chip 110 to which power source is provided and the phosphor 151 surrounding the light emitting diode chip 110, and first light emitted by the light emitting diode chip 110 is excited by the phosphor 151 and thereby second light is generated.

For example, the light emitting diode chip 110 may be an InGaN-based light emitting diode chip releasing light having a light emitting peak in a wavelength range of 380 nm to 500 nm, but other light emitting diode chips such as a laser diode or a surface light emitting laser diode may also be used.

In addition, instead of the light emitting diode as a light source, an inorganic electroluminescent device or an organic electroluminescent device may also be used.

Meanwhile, the light emitting devices manufactured according to examples of the present invention include a light source releasing light, a substrate supporting the light source, and a molding member molded around the light source. The molding member may use at least any one of an epoxy resin, a silicon resin, a urea resin, an acrylic resin, and a polyimide resin, as a light transmissive resin. In addition, the molding member may be a single structure or a multiple structure, and the phosphor 151 may be mixed with other phosphor besides phosphors according examples of the present invention.

In addition, the present invention provides a coating phosphor composition for a light emitting device including the phosphor 151 and a transmissive resin. The phosphor 151 and the transmissive resin in the coating phosphor composition may be mixed in any weight ratios.

However, the composition of the white light emitting diode according to the present invention is not limited to the above composition embodiments and constitution elements according to conventional technology may be freely added, changed and deleted.

Now, the present invention will be described in more detail with reference to the following examples. These examples are provided only for illustration of the present invention and should not be construed as limiting the scope and spirit of the present invention.

EXAMPLE 1

5.2954 g of $Y_2O_3$ of, 4.1646 g of $Al_2O_3$, and 0.5663 g of $ThO_2$ were added to 50 mL of acetone and then wet mixed for five hours using a ball mill. A resulting mixture was dried for 1 hour in a 100° C. dryer to completely volatilize a solvent. The mixture was inserted into an alumina crucible and then heat-treated for 20 hours at 1,600° C. Here, the heat treatment was performed while supplying nitrogen mix gas mixed with 5% hydrogen at a rate of 1,000 cc/min. Phosphor, heat-treating of which was completed, was comminuted, and classified using a classifier. The phosphor, classification of which was completed, included unreacted materials, and thereby was ultrasonically cleaned for 10 minutes in distilled water and then dried. As a result, garnet-based phosphor doped with thorium was prepared.

In the present invention, an empirical formula as described below was made and then experiments were performed, to optimize a composition of Formula 1.

[Formula 1-1]

* Experimental composition 1: in the formula, $0.07 \leq x \leq 0.15$, L=Y, and N=Al.

Here, with the respect to the experimental composition 1, Experiments 1 to 5 according to a concentration of thorium were performed. Formula compositions of the experiments are shown in Table 1.

TABLE 1

| NO. | Y | Al | O | Th |
|---|---|---|---|---|
| 1 | 2.93 | 5 | 12 | 0.07 |
| 2 | 2.91 | 5 | 12 | 0.09 |
| 3 | 2.89 | 5 | 12 | 0.11 |
| 4 | 2.87 | 5 | 12 | 0.13 |
| 5 | 2.85 | 5 | 12 | 0.15 |

Figure 3:
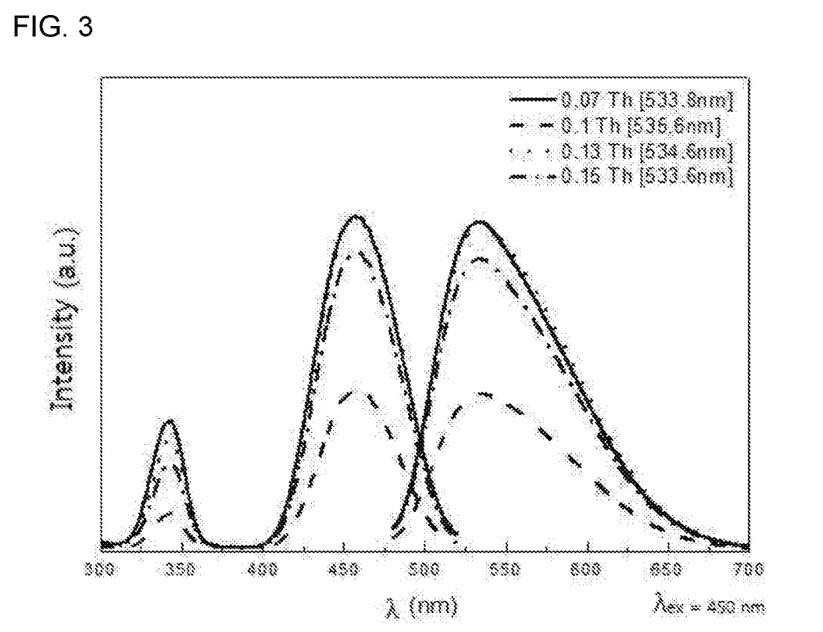
FIG. 3 illustrates a light emission spectrum result of a phosphor according to Example 1.

FIG. 3 shows a light emitting spectrum result of each phosphor prepared according to Table 1. In FIG. 3, a vertical axis indicates light emitting intensity and a horizontal axis indicates a light emitting wavelength.

Referring to FIG. 3, the garnet-based phosphor according to the present invention exhibits stable light emission intensity despite concentration change of thorium and a light emitting central wavelength of 533.6 to 533.8 nm. In addition, a highest luminance is exhibited when 0.13 mol of thorium is added, but no substantial difference is exhibited among samples to which 0.07 mol to 0.13 mol of thorium was added.

EXAMPLE 2

5.2954 g of $Y_2O_3$ of, 4.1646 g of $Al_2O_3$, 0.5663 g of $ThO_2$, and 1.0026 g of $BaF_2$ were added to 50 mL of acetone and then wet mixed for five hours using a ball mill. A resulting mixture was dried for 1 hour in 100° C. dryer to completely volatilize a solvent. The mixture was then placed in an alumina crucible and heat-treated for 20 hours at 1,600° C. Here, the heat treatment was performed while supplying nitrogen gas mixed with 5% hydrogen at a rate of 1,000 cc/min. A phosphor, heat treatment of which had been completed, was comminuted, and classified using a classifier. The phosphor, classification of which was completed, included unreacted materials and, as such, was ultrasonically cleaned for 10 minutes in distilled water and then dried. As a result, a garnet-based phosphor doped with thorium was prepared.

In Experiments 6 to 10 with respect to Experimental composition 2 below, a modification of the composition of Formula 1-1, the concentration of thorium was fixed and addition amounts of $BaF_2$ as a flux were controlled. Formula compositions are shown in Table 2 below.

* Experimental composition 2: x=0.13, L=Y, N=Al, Flux=$BaF_2$ (2 wt %, 4 wt %, 6 wt %, 8 wt %, 10 wt %)

TABLE 2

| NO. | Y | Al | O | Th | $BaF_2$ (wt %) |
|---|---|---|---|---|---|
| 6 | 2.87 | 5 | 12 | 0.13 | 4 |
| 7 | 2.87 | 5 | 12 | 0.13 | 6 |
| 8 | 2.87 | 5 | 12 | 0.13 | 8 |
| 9 | 2.87 | 5 | 12 | 0.13 | 10 |
| 10 | 2.87 | 5 | 12 | 0.13 | 12 |

Figure 4:
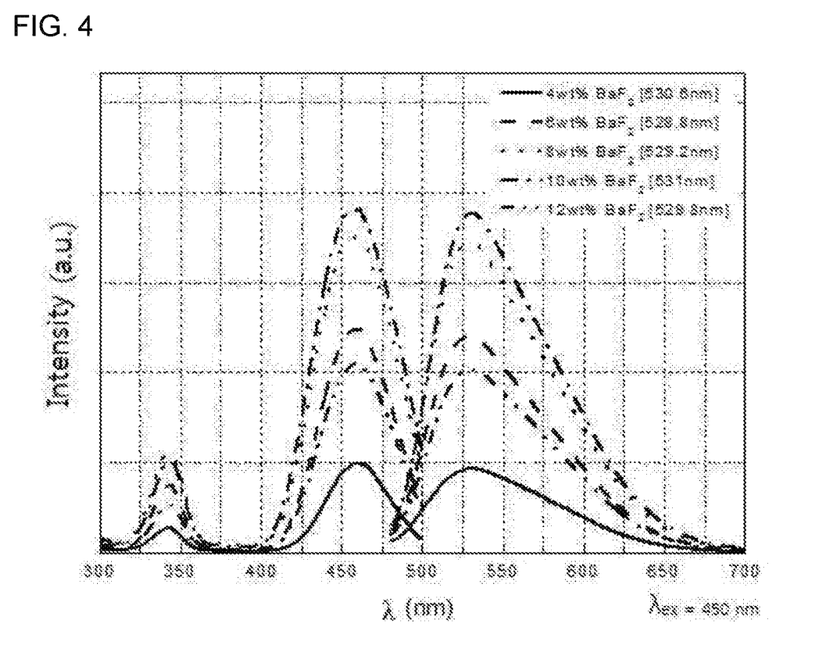
FIG. 4 illustrates a light emission spectrum result of a phosphor according to Example 2.

FIG. 4 shows a light emitting spectrum result of each phosphor prepared according to Table 2. In FIG. 4, the vertical axis indicates light emitting intensity and the horizontal axis indicates a light emitting wavelength.

Referring to FIG. 4, the garnet-based phosphor according to the present invention exhibits improved light emitting intensity when a flux is added, and highest light intensity improvement effect when $BaF_2$ is added in an amount of 10 wt %.

EXAMPLE 3

6.8962 g of Lu$_2$O$_3$, 2.9853 g of Al$_2$O$_3$, 0.1249 g of ThO$_2$, and 0.4003 g of BaF$_2$ were added to 50 mL of acetone and then wet mixed for five hours using a ball mill. A resulting mixture was dried for 1 hour in a 100° C. dryer to completely volatilize a solvent. The mixture was inserted into an alumina crucible and then heat-treated for 20 hours at 1,600° C. Here, the heat treatment was performed while supplying nitrogen gas mixed with 5% hydrogen at a rate of 1,000 cc/min. Phosphor, heat treatment of which had been completed, was comminuted, and classified using a classifier. The phosphor, classification of which was completed, included unreacted materials and, as such, was ultrasonically cleaned for 10 minutes in distilled water and then dried. As a result, a garnet-based phosphor doped with thorium was prepared.

With respect to Experimental composition 3 below modifying the composition of Formula 1-1, Experiments 11 to 15, in which the concentration of thorium was varied, were performed. Formula compositions are shown in Table 3 below.

* Experimental composition 3: $0.01 \leq x \leq 0.05$, L=Lu, and N=Al.

TABLE 3

| NO. | Lu | Al | O | Th | BaF$_2$ (wt %) |
|---|---|---|---|---|---|
| 11 | 2.99 | 5 | 12 | 0.01 | 4 |
| 12 | 2.98 | 5 | 12 | 0.02 | 4 |
| 13 | 2.97 | 5 | 12 | 0.03 | 4 |
| 14 | 2.96 | 5 | 12 | 0.04 | 4 |
| 15 | 2.95 | 5 | 12 | 0.05 | 4 |

Figure 5:
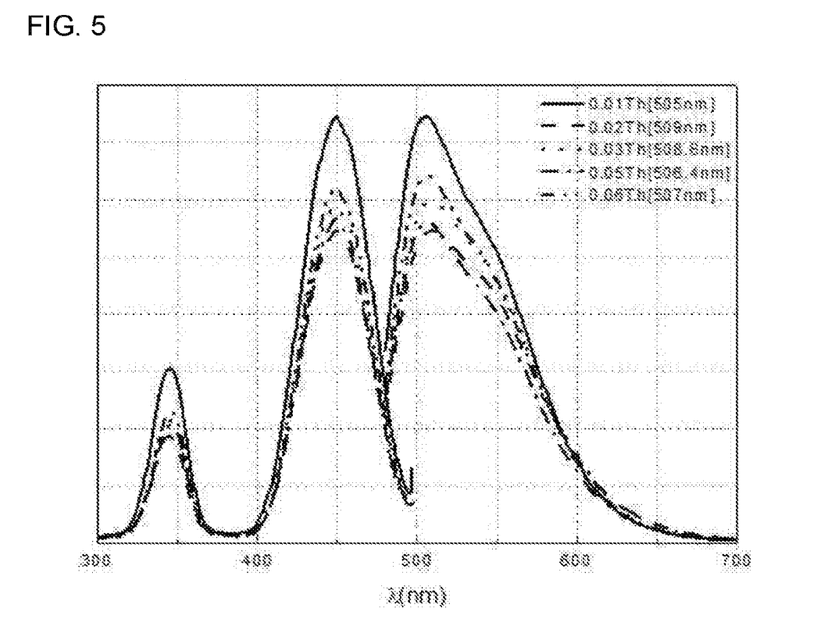
FIG. 5 illustrates a light emission spectrum result of a phosphor according to Example 3.

FIG. 5 shows a light emitting spectrum result of each phosphor prepared according to Table 3. In FIG. 5, the vertical axis indicates light emitting intensity and the horizontal axis indicates a light emitting wavelength.

Referring to FIG. 5, the garnet-based phosphor according to the present invention exhibits a fixed central wavelength despite concentration change of thorium and differs only in light emitting intensity. The light emitting intensity is highest when thorium is added in an amount of 0.01 mol.

EXAMPLE 4

6.8401 g of Tb$_4$O$_7$, 3.1524 g of Al$_2$O$_3$, 0.2308 g of ThO$_2$, and 0.4089 g of BaF$_2$ were added to 50 mL of acetone and then wet mixed for five hours using a ball mill. A resulting mixture was dried for 1 hour in a 100° C. dryer to completely volatilize a solvent. The mixture was inserted into an alumina crucible and then heat-treated for 20 hours at 1,600° C. Here, the heat treatment was performed while supplying nitrogen gas mixed with 5% hydrogen at a rate of 1,000 cc/min. After completing heat treatment, the phosphor was comminuted, and classified using a classifier. The phosphor, classification of which was completed, included unreacted materials, and thereby was ultrasonically cleaned for 10 minutes in distilled water and then dried. As a result, garnet-based phosphor doped with thorium was prepared.

With respect to Experimental Composition 4 below modified from a composition of Formula 1-1, Experiments 16 to 21 according to concentration of thorium were carried out. Formula compositions with respect to the experiments are shown in Table 4.

* Experimental Composition 4: $0.01 \leq x \leq 0.06$, L=Tb, and N=Al

TABLE 4

| NO. | Tb | Al | O | Th | BaF$_2$ (wt %) |
|---|---|---|---|---|---|
| 16 | 2.99 | 5 | 12 | 0.01 | 4 |
| 17 | 2.98 | 5 | 12 | 0.02 | 4 |
| 18 | 2.97 | 5 | 12 | 0.03 | 4 |
| 19 | 2.96 | 5 | 12 | 0.04 | 4 |
| 20 | 2.95 | 5 | 12 | 0.05 | 4 |
| 21 | 2.94 | 5 | 12 | 0.06 | 4 |

Figure 6:
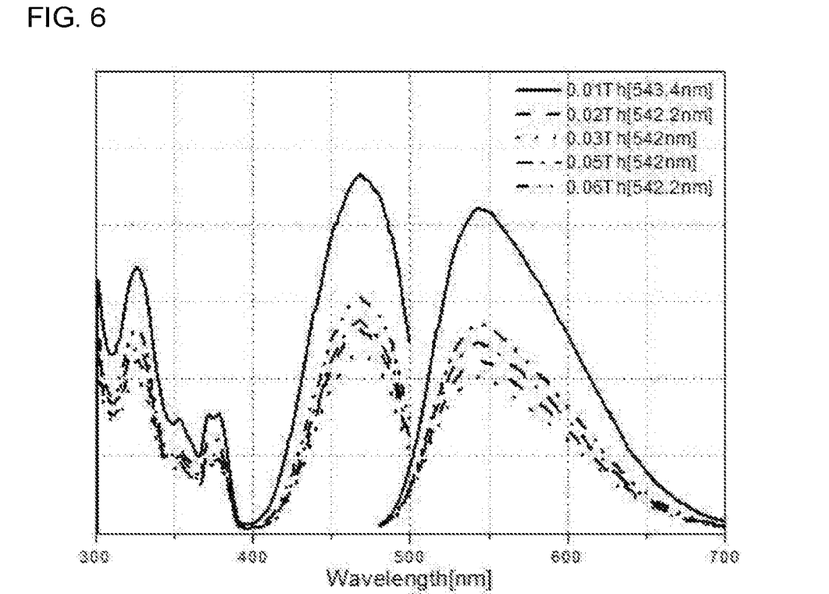
FIG. 6 illustrates a light emission spectrum result of a phosphor according to Example 4.

FIG. 6 illustrates a light emitting spectrum result of each phosphor prepared according to Table 4. The vertical axis indicates light emitting intensity and the horizontal axis indicates light emitting wavelength.

Referring to FIG. 6, each of the garnet-based phosphors according to the present invention exhibits nearly no wavelength change according to concentration change of thorium and, when thorium is added in an amount of 0.01 mol, light is stably emitted around 543 nm.

EXAMPLE 5

6.8962 g of Lu$_2$O$_3$, 2.9853 g of Al$_2$O$_3$, 0.1249 g of ThO$_2$, 0.4003 g of BaF$_2$, and 0.0450 g of LiCO$_3$ were added to 50 mL of acetone and then wet mixed for five hours using a ball mill. A resulting mixture was dried for 1 hour in a 100° C. dryer to completely volatilize a solvent. The mixture was inserted into an alumina crucible and then heat-treated for 20 hours at 1,600° C. Here, the heat treatment was performed while supplying nitrogen gas mixed with 5% hydrogen at a rate of 1,000 cc/min. Phosphor, heat treatment of which was completed, was comminuted, and classified using a classifier. The phosphor, classification of which was completed, included unreacted materials and, as such, was ultrasonically cleaned for 10 minutes in distilled water and then dried. As a result, a garnet-based phosphor doped with thorium was prepared.

With respect to Experimental Composition 5 using Formula 1-2 below, Experiments 22 to 26 were carried out. Formula Compositions with respect to the experiments are shown in Table 5.

$$(L_{1-x}Th_xM_y)_3N_5O_{12} \quad \text{[Formula 1-2]}$$

* Experimental Composition 5: x=0.01, L=Lu, N=Al, M=Li, and $0 \leq y \leq 0.2$.

TABLE 5

| NO. | Lu | Al | O | Th | Li | BaF$_2$ (wt %) |
|---|---|---|---|---|---|---|
| 22 | 2.99 | 5 | 12 | 0.01 | 0.00 | 4 |
| 23 | 2.94 | 5 | 12 | 0.01 | 0.05 | 4 |
| 24 | 2.89 | 5 | 12 | 0.01 | 0.1 | 4 |
| 25 | 2.84 | 5 | 12 | 0.01 | 0.15 | 4 |
| 26 | 2.79 | 5 | 12 | 0.01 | 0.20 | 4 |

Figure 7:
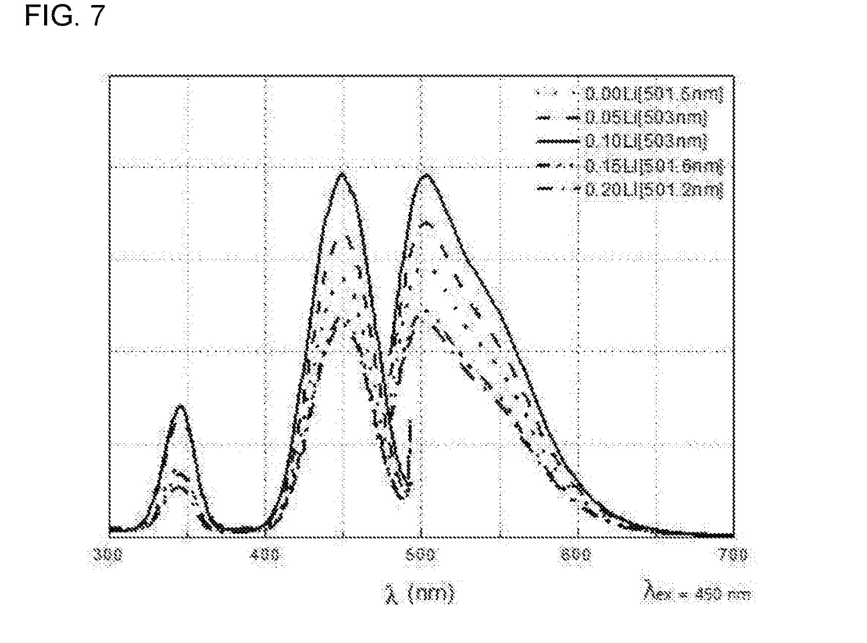
FIG. 7 illustrates a light emission spectrum result of a phosphor according to Example 5.

FIG. 7 illustrates a light emitting spectrum result of each phosphor prepared according to Table 5. In FIG. 7, the vertical axis indicates light emitting intensity and the horizontal axis indicates light emitting wavelength.

Referring to FIG. 7, each of the garnet-based phosphor according to the present invention emits light at 501 nm to 503 nm according concentration change of thorium and, when thorium is added in an amount of 0.1 mol, highest luminance is exhibited.

EXAMPLE 6

6.7472 g of Lu$_2$O$_3$, 3.0549 g of Al$_2$O$_3$, 0.0320 g of ThO$_2$, 0.4005 g of BaF$_2$, 0.0447 g of LiCO$_3$, and 0.1344 g of Tb$_4$ $O_7$ were added to 50 mL of acetone and then wet mixed for five hours using a ball mill. A resulting mixture was dried during for 1 hour in a 100° C. dryer to completely volatilize a solvent. The mixture was placed in an alumina crucible and then heat-treated for 20 hours at 1,600° C. Here, heat-treating was performed while supplying nitrogen gas mixed with 5% hydrogen at a rate of 1,000 cc/min. Phosphor, heat treatment of which was completed, was comminuted, and classified using a classifier. The phosphor, classification of which was completed, included unreacted materials and, as such, was ultrasonically cleaned for 10 minutes in distilled water and then dried. As a result, a garnet-based phosphor doped with thorium was prepared.

With respect to Experimental Composition 6 using Formula 1-2 below, Experiment 27 was carried out. Formula Compositions with respect to the experiments are shown in Table 6.

$$(L_{1-x}Th_xM_y)_3N_5O_{12}$$ [Formula 1-2]

\* Experimental Composition 6: x=0.06, L=Lu, N=Al, M=Li, Tb, and y=0.16.

TABLE 6

| NO. | Lu | Al | O | Th | Li | Tb | BaF$_2$ (wt %) |
|---|---|---|---|---|---|---|---|
| 27 | 2.83 | 5 | 12 | 0.01 | 0.1 | 0.06 | 4 |

Figure 8:
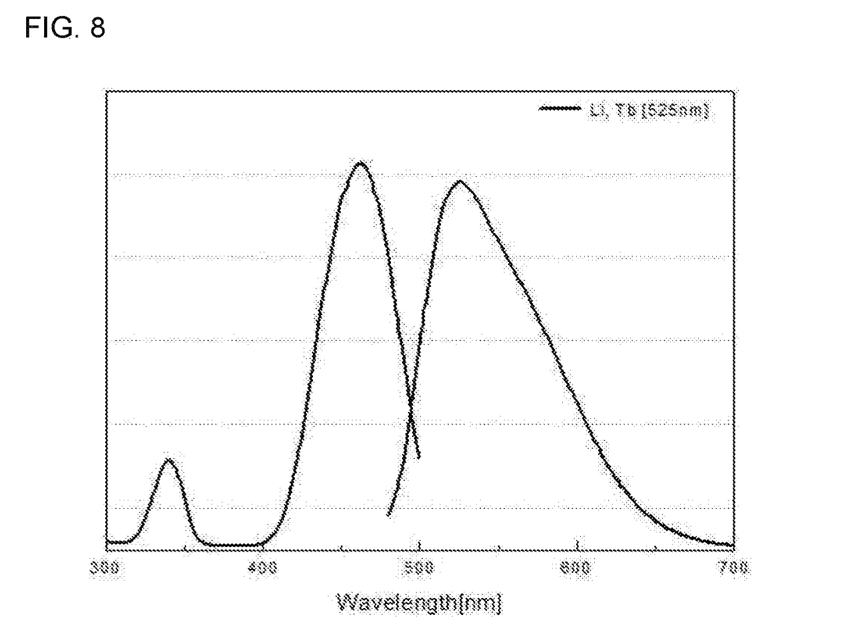
FIG. 8 illustrates a light emission spectrum result of a phosphor according to Example 6.

FIG. 8 illustrates a light emitting spectrum result of each phosphor prepared according to Table 6. In FIG. 8, the vertical axis indicates light emitting intensity and the horizontal axis indicates light emitting wavelength.

Referring to FIG. 8, the garnet-based phosphor according to the present invention emits light when Li and Tb are used as an M element of Formula 1.

EXAMPLE 7

By Examples 1 to 6, it can be confirmed that Formula 1 preferably satisfies a condition: 0<x<1 and y=0. In addition, Formula 1 more preferably satisfies a condition: 0<x<1 and y=0, L is Y, and N is Al.

Accordingly, the garnet-based phosphor prepared according to each of Examples 1 to 6 and a light emitting diode chip 110 of InGaN having a central wavelength of approximately 460 nm were used to prepare white light emitting diode as illustrated in FIG. 1. Here, the light emitting diode chip and the garnet-based phosphor were molded with a transmissive resin. A garnet-based phosphor 151 was excited by blue light (460 nm) generated from the light emitting diode chip 110 and thereby light having primary light (central wavelength of emitted light) of approximately 500 nm to 550 nm was emitted.

EXAMPLE 8

A light emitting diode was prepared in the same manner as in Example 7, except that the phosphor of Example 1 and (CaSr)AlSiN$_3$ were mixed in a weight ratio of 90:10 and then used.

As a result, the garnet-based phosphor 151 emitted light having primary light of approximately 530 nm to 580 nm by being excited by blue light (460 nm) generated by the light emitting diode chip 110.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

DESCRIPTIONS OF REFERENCE NUMERALS

110: LIGHT EMITTING DIODE CHIP
120: SUBSTRATE
130: CONDUCTIVE MEMBER
131: ELECTRODE LAYER
140: WIRE
150: MOLDING MEMBER
151: PHOSPHOR

The invention claimed is:

1. A garnet-based phosphor doped with thorium as a main activator represented by Formula 1 below:

$$(L_{1-x-y}Th_xM_y)_3N_5O_{12}$$ [Formula 1]

wherein 0<x<1, 0≤y<1, and x+y<1,
L is at least one selected from the group consisting of Y, Gd, Lu, Sc, La, Bi, Ir and Sb,
M is selected from the group consisting of Pr, Tb, Sm, Se, U, Li and Na,
N is at least one selected from the group consisting of Al, Ga and In, and the phosphor does not contain cerium.

2. The garnet-based phosphor according to claim 1, wherein, in Formula 1, 0<x<1 and y=0.

3. The garnet-based phosphor according to claim 1, wherein, in Formula 1, 0<x<1, y=0, L is Y, and N is Al.

4. The garnet-based phosphor according to claim 1, wherein the phosphor of Formula 1 is prepared using at least one flux selected from the group consisting of NH4Cl, NH4F, BaF2, CaF2, MgF2, YF3, YCl3 and LiCl.

5. The garnet-based phosphor according to claim 1, wherein, when ultraviolet light or visible light having a wavelength of 100 nm to 600 nm is used as an excitation source, light is emitted.

6. The garnet-based phosphor according to claim 1, wherein a central light emitting wavelength of the phosphor is 490 to 700 nm.

7. A mixed phosphor comprising:
the garnet-based phosphor of Formula 1 according to claim 1; and
two or more of compounds selected from the group consisting of (CaSr)AlSiN3, SrGaS4, CaS, α-SiAlON, β-SiAlON, (SrBaCa)2Si1O4, (SrBaCa)1Si2O2N2, (CaSr)2Si5N8 and La3Si6N11.

8. A light emitting device comprising the phosphor according to claim 1.

9. The light emitting device according to claim 8, wherein a color rendering (Ra) is greater than 80.

10. The light emitting device according to claim 8, wherein the light emitting device is a light emitting diode, a laser diode, a surface light emitting laser diode, an inorganic electroluminescent device, or an organic electroluminescent device.

11. The light emitting device according to claim 10, wherein a light emitting diode chip in the light emitting diode is a blue light emitting diode chip.

12. The light emitting device according to claim 10, wherein a light emitting diode chip and the phosphor in the light emitting diode are molded by a transmissive resin.

13. A coating phosphor composition for a light emitting diode comprising the garnet-based phosphor of Formula 1 according to claim 1 and a transmissive resin.

\* \* \* \* \*